(12) United States Patent
Kobayashi (10) Patent No.: US 7,154,753 B2
(45) Date of Patent: Dec. 26, 2006

(54) CIRCUIT STRUCTURAL BODY AND METHOD FOR MANUFACTURING THE SAME

(75) Inventor: Takehito Kobayashi, Aichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 128 days.

(21) Appl. No.: 10/754,717

(22) Filed: Jan. 12, 2004

(65) Prior Publication Data

US 2004/0160754 A1    Aug. 19, 2004

(30) Foreign Application Priority Data

Jan. 14, 2003   (JP)   ............................. 2003-005950

(51) Int. Cl.
    *H05K 7/20* (2006.01)
(52) U.S. Cl. ...................... 361/715; 361/719; 361/794; 361/799; 361/796; 361/797; 257/706; 257/707
(58) Field of Classification Search ................ 361/719, 361/720, 794, 799, 704, 709, 696–697, 723, 361/760, 761, 781–782; 257/706–707, 713
See application file for complete search history.

(56) References Cited

U.S. PATENT DOCUMENTS

| | | | | | |
|---|---|---|---|---|---|
| 5,835,356 | A | * | 11/1998 | Wieloch et al. | 361/761 |
| 5,928,004 | A | * | 7/1999 | Sumida et al. | 439/76.2 |
| 6,049,468 | A | * | 4/2000 | Learmonth | 361/816 |
| 6,214,525 | B1 | * | 4/2001 | Boyko et al. | 430/313 |
| 2001/0012212 | A1 | * | 8/2001 | Ikeda | 363/141 |
| 2004/0160731 | A1 | * | 8/2004 | Yamaguchi | 361/600 |

FOREIGN PATENT DOCUMENTS

JP         A 10-35375         2/1998

* cited by examiner

Primary Examiner—Elvin Enad
Assistant Examiner—Hung S. Bui
(74) Attorney, Agent, or Firm—Oliff & Berridge, PLC (57) ABSTRACT

A circuit structural body includes a printed circuit board having a conductive pattern constituting a power circuit including a semiconductor switching element and disposed on one surface of the printed circuit board, and a conductive pattern constituting a control circuit for controlling the semiconductor switching element and disposed on the other surface of the printed circuit board. The printed circuit board has a through-hole for mounting the semiconductor switching element to both of the conductive patterns. The circuit structural body can be manufactured by a method including the step of laminating a reinforcing plate to one surface of the printed circuit board and the step of mounting the semiconductor switching element from the opposite side to the reinforcing plate.

17 Claims, 5 Drawing Sheets

CIRCUIT STRUCTURAL BODY AND METHOD FOR MANUFACTURING THE SAME

BACKGROUND OF THE INVENTION

1. Field of the Invention

The present invention relates to a circuit structural body provided with a combination of a bus-bar which constitutes a power circuit and a printed circuit board for controlling drive of a semiconductor switching element provided in the power circuit, and a method of manufacturing the same.

2. Description of the Related Art

In the related art, as means for distributing electric power to the respective electronic units from a common vehicle-mounted power source, an electric connection box in which a power distributing circuit formed by laminating a plurality of bus-bar boards is provided and a fuse and a relay switch are built in the circuit is generally known.

In addition, in order to realize downsizing of such electric connection box and high-speed switching control, a structure in which a semiconductor switching element such as FET is interposed between an input terminal and an output terminal in stead of the relay has been developed in recent years.

For example, JP-A-10-35375 discloses an electric connection box including a bus-bar board forming a current circuit, a FET as a semiconductor switching element to be built in the current circuit, and a printed circuit board for controlling operation of the FET. In this electric connection box, the bus-bar board and the printed circuit board are disposed in two levels on the upper side and the lower side at a distance apart from each other, and the FET is interposed between the two. A drain terminal and a source terminal of the FET are connected to the bus-bar board, and a gate terminal of the FET is connected to the printed circuit board.

In the electric connection box disclosed in JP-A-10-35375, at least two boards, that is, the bus-bar board and the printed circuit board, are necessary, and in addition, it is necessary to secure enough space for disposing these boards three dimensionally at a distance apart from each other and disposing the FET between these boards. Therefore, although a relay-type electric connection box in the related art may be downsized by introducing the FET, the entire structure is too complicated to realize sufficient downsizing and, in particular, reduction of the height continues to be an important task.

Since the FET is interposed between the bus-bar board and the printed circuit board in the electric connection box, heat generated by the FET is liable to stay between these boards, and thus a complicated structure must be employed for heat dissipation.

In addition, in the electric connection box, since the drain terminal and the source terminal of the FET is connected to the bus-bar board on the lower side, and the gate terminal is connected to the printed circuit board on the upper side, assembly of the entire electric connection box is complicated, and thus automatization is difficult. Therefore, improvement of such problems is demanded.

SUMMARY OF THE INVENTION

In view of such circumstances, it is an object of the present invention to provide a circuit structural body in which a power circuit including a semiconductor switching element such as FET can be built in a simple and slim structure, and which is superior in heat dissipation, and further to provide a method of manufacturing the circuit structural body efficiently.

As means for solving the above described problems, the present invention provides a circuit structural body including: a semiconductor switching element; a power circuit for outputting an inputted electric power through the semiconductor switching element; a control circuit for controlling drive of the semiconductor switching element; and a printed circuit board having a board body, a conductive pattern constituting the power circuit and disposed on one surface thereof, and a conductive pattern constituting the control circuit and disposed on the other surface thereof; wherein the board body has a through-hole for mounting the semiconductor switching element thereon; and the semiconductor switching element is mounted to one of the conductive patterns on the printed circuit board from the front side of the conductive pattern, and to the other conductive pattern from the backside of the conductive pattern through the through-hole.

The "front side of the conductive pattern" indicates the side of a conductive pattern surface that is opposite to a conductive pattern surface facing the printed circuit board. The "backside of the conductive pattern" indicates the side of a conductive pattern surface facing the printed circuit board. In this arrangement, since the conductive pattern constituting the power circuit is provided on one of the surfaces of the printed circuit board, and the conductive pattern constituting the control circuit of the semiconductor switching element included in the power circuit is provided on the other surface, respectively, both of the establishment of the power circuit and the control of the semiconductor switching element included in the same circuit can be realized simultaneously. Therefore, the entire circuit structural body is significantly slimmed and simplified and heat dissipation is improved in comparison with the electric connection box in which the bus-bar board and the printed circuit board are disposed at a distance apart from each other and the semiconductor switching element is connected to both of the boards, as in the related art.

In addition, since the semiconductor switching element can be mounted to the conductive pattern on the back side through the through-hole formed in the printed circuit board, the semiconductor element can be mounted from one side to both the power circuit and the control circuit simultaneously.

In this circuit structural body, since the printed circuit board is generally thin and low in rigidity, it is more preferable to laminate a reinforcing plate over one of the conductive patterns of the printed circuit board to which the semiconductor switching element is mounted from the backside.

Provision of such laminated reinforcing plate increases rigidity of the entire circuit structural body and facilitates its handling. In particular, when mounting the semiconductor switching element from the side opposite from the reinforcing plate, sufficient supporting rigidity of the board is achieved.

In this case, for example, an aluminum plate or an aluminum alloy plate is adequate for the reinforcing plate, and heat dissipation may be enhanced when these are applied. In addition, insulation between the conductive patterns may be maintained by overlapping the reinforcing plate on one of the conductive pattern on the printed circuit board via an insulating layer.

The detailed structure of the semiconductor switching element makes no difference in the present invention. However, in the case where a conducting terminal is provided on the back side of a main body, stable mounting of the semiconductor switching element to the printed circuit board is achieved by forming a through-hole of a size which can accommodate the main body of the semiconductor switching element therein, and mounting the conductive terminal on the backside of the main body of the semiconductor switching element to the conductive pattern which constitutes the power circuit.

In this case, heat generated from the semiconductor switching element can be dissipated effectively through the reinforcing plate by employing such structure that the reinforcing plate formed of aluminum or aluminum alloy is fixed via the insulating layer to one of the surfaces of the printed circuit board having the conductive pattern which constitutes the power circuit thereon.

In addition, heat dissipation is further improved by employing a structure in which the reinforcing plate is fixed via an insulating layer to a heat dissipating member.

In the present invention, it is more preferable that a terminal for connecting the power circuit or the control circuit to the external circuit is connected to the adequate conductive pattern of the printed circuit board. In this arrangement, the power circuit or the control circuit can easily be connected via the terminal to the external circuit.

In this case, when providing a case for accommodating the printed circuit board and providing a housing for surrounding the terminal and constituting the connector together with the terminal in the case, the printed circuit board may be protected by the case and, simultaneously, connection of the power circuit and the control circuit to the external circuit can easily be performed by using the connector made up of the housing and the terminal formed on the case.

The terminal preferable in this application is fixed to the printed circuit board in a penetrated state through the printed circuit board in the direction of the thickness and projects into the housing through the case in the direction of thickness. In this arrangement, the connector for connecting the printed circuit board and the external circuit may be realized by simply setting up the terminal on the printed circuit board.

In addition, the strength of the case for supporting the printed circuit board may further be increased by employing such structure that the case is divided along the direction parallel to the printed circuit board, and divided case halves are connected to each other with the printed circuit board interposed therebetween.

When the heat dissipating member for cooling the printed circuit board is provided, stable support and heat dissipation of the printed circuit board can be realized simultaneously by employing such structure that the printed circuit board is interposed between the heat dissipating member and the case.

The present invention also provides a method of manufacturing a circuit structural body provided with a power circuit for outputting an electric power supplied to an input unit to an output unit via a semiconductor switching element, and a control circuit for controlling drive of the semiconductor switching element, the method comprising the steps of: manufacturing a printed circuit board having a board body, a conductive pattern constituting the power circuit and disposed on one surface thereof, a conductive pattern constituting the control circuit and disposed on the other surface thereof, and a through-hole for mounting the semiconductor switching element on the board body; fixing a reinforcing plate to one surface of the printed circuit board via an insulating layer; and mounting the semiconductor switching element directly to one of the conductive patterns on the printed circuit board from the opposite side to the reinforcing plate and mounting the same to the other conductive pattern through the through-hole.

According to this manufacturing method, the adequate semiconductor switching element can be mounted to the conductive patterns on the front and the back surfaces from one side of the printed circuit board utilizing the through-hole formed in advance in the printed circuit board, whereby a slim circuit structural body can easily be manufactured in a simple process. Therefore, working efficiency is dramatically simplified in comparison with the structure in the related art in which the terminals of the semiconductor switching element are connected individually to the bus-bar board and the printed circuit board disposed at a distance from each other.

In this case, by providing a step having a height corresponding substantially to the thickness of the printed circuit board between the terminal of the semiconductor switching element which is to be mounted to the conductive pattern on the front side of the printed circuit board and the terminal which is to be mounted through the through-hole, the respective terminals can be mounted both to the printed circuit board and the bus-bar as they are irrespective of the thickness of the printed circuit board without forcing the respective terminals of the semiconductor switching element to be deformed. Therefore, the stress exerted to the respective terminals after mounting can significantly be reduced.

In addition to the above-described steps, by performing a terminal connecting step for connecting a terminal for connecting the power circuit or the control circuit to the external circuit to the adequate conductive pattern on the printed circuit board in a penetrated state through the printed circuit board, the circuit structural body which is connectable to the external circuit can be efficiently manufactured.

Furthermore, by performing a connector forming step for forming a housing formed of an insulating material around the terminal after the terminal connecting step, the circuit structural body which can easily be connected to the external circuit may be obtained.

Still further, by fixing the reinforcing plate formed of aluminum or aluminum alloy to the printed circuit board in the reinforcing plate fixing step, and then performing a heat dissipating member connecting step for connecting a heat dissipating member to the reinforcing plate via an insulating layer after the mounting step, the circuit structural body superior in heat dissipation may be obtained owing to the combined usage of the reinforcing plate formed of aluminum or aluminum alloy and the heat dissipating member.

DETAILED DESCRIPTION OF PREFERRED EMBODIMENTS

Referring now to the drawings, a preferred embodiment of the present invention will be described. In this embodiment, a method of manufacturing a circuit structural body constituting a distributing circuit for distributing an electric power supplied from a common power source mounted on a vehicle or the like to a plurality of electric loads will be described. However, the application of the circuit structural body of the present invention is not limited thereto, and may be widely applied to the case in which ON/OFF switching of the power circuit is performed by the semiconductor switching element.

Figure 1:
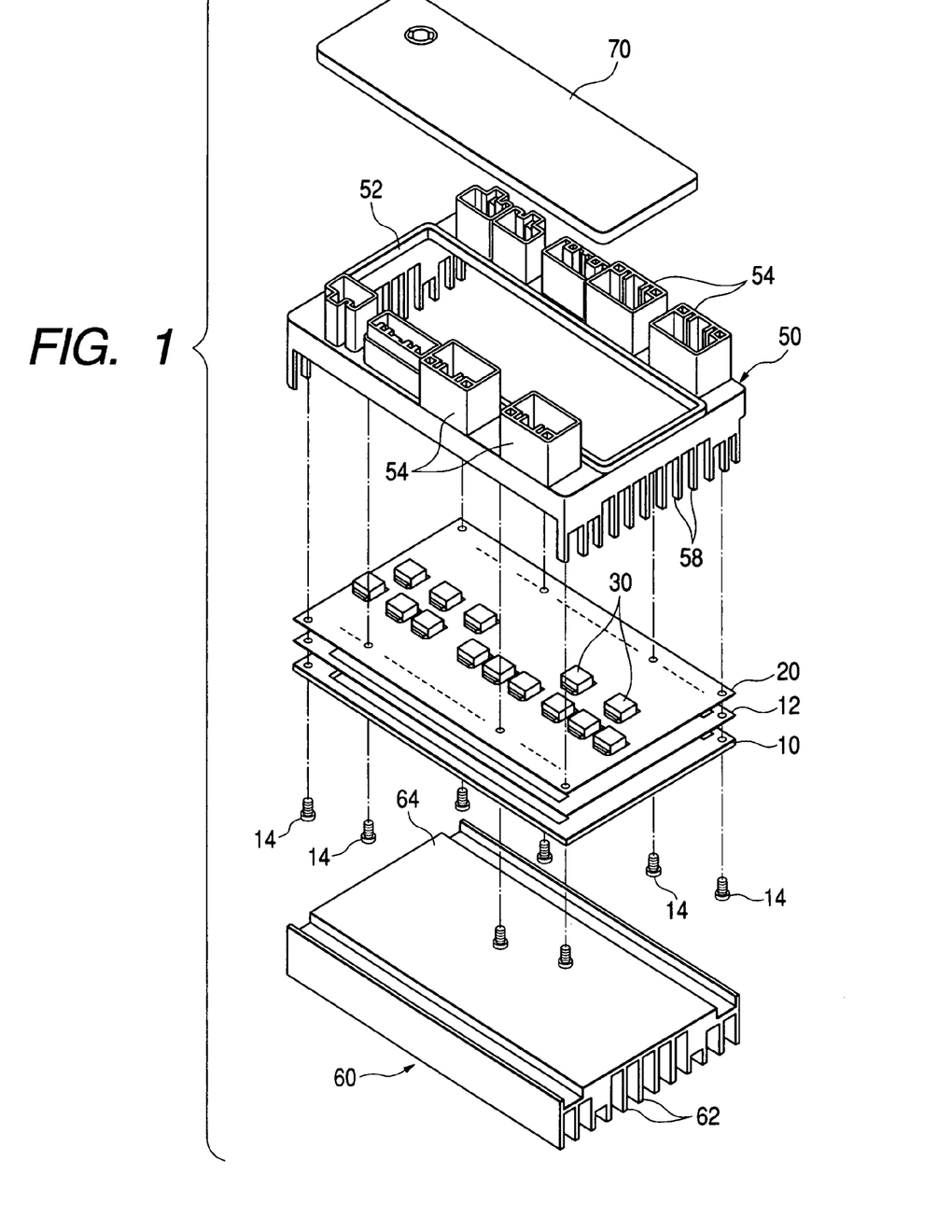
FIG. 1 is an exploded perspective view of a circuit structural body according to an embodiment of the present invention.
Figure 2:
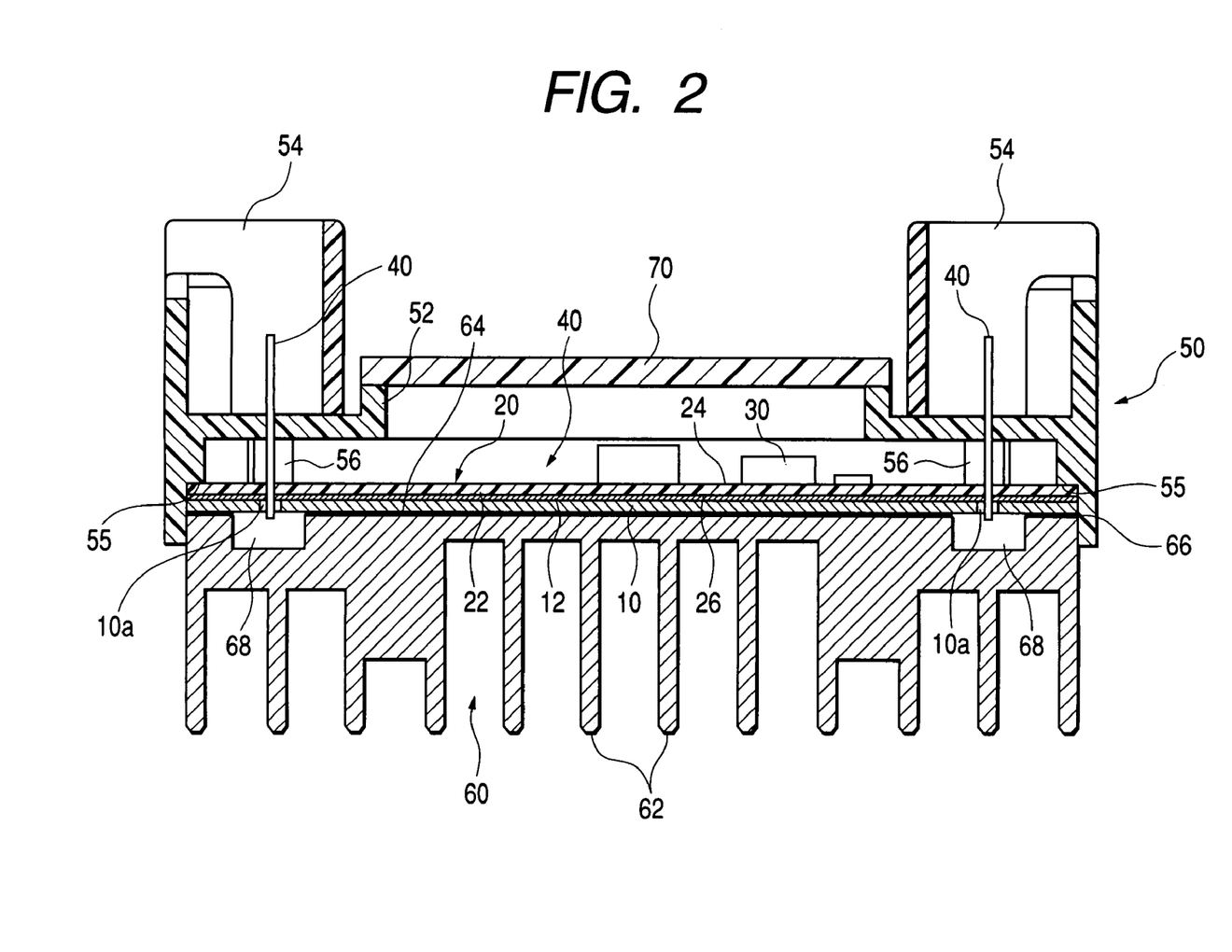
FIG. 2 is a cross-sectional view of the circuit structural body.

FIG. 1 and FIG. 2 show the entire structure of the circuit structural body according to the present embodiment. The circuit structural body includes a single printed circuit board 20, a plurality of semiconductor switching elements (FET 30 in the drawing), a plurality of terminal pins 40, an insulating case 50, and a heat dissipating member 60.

Figure 3:
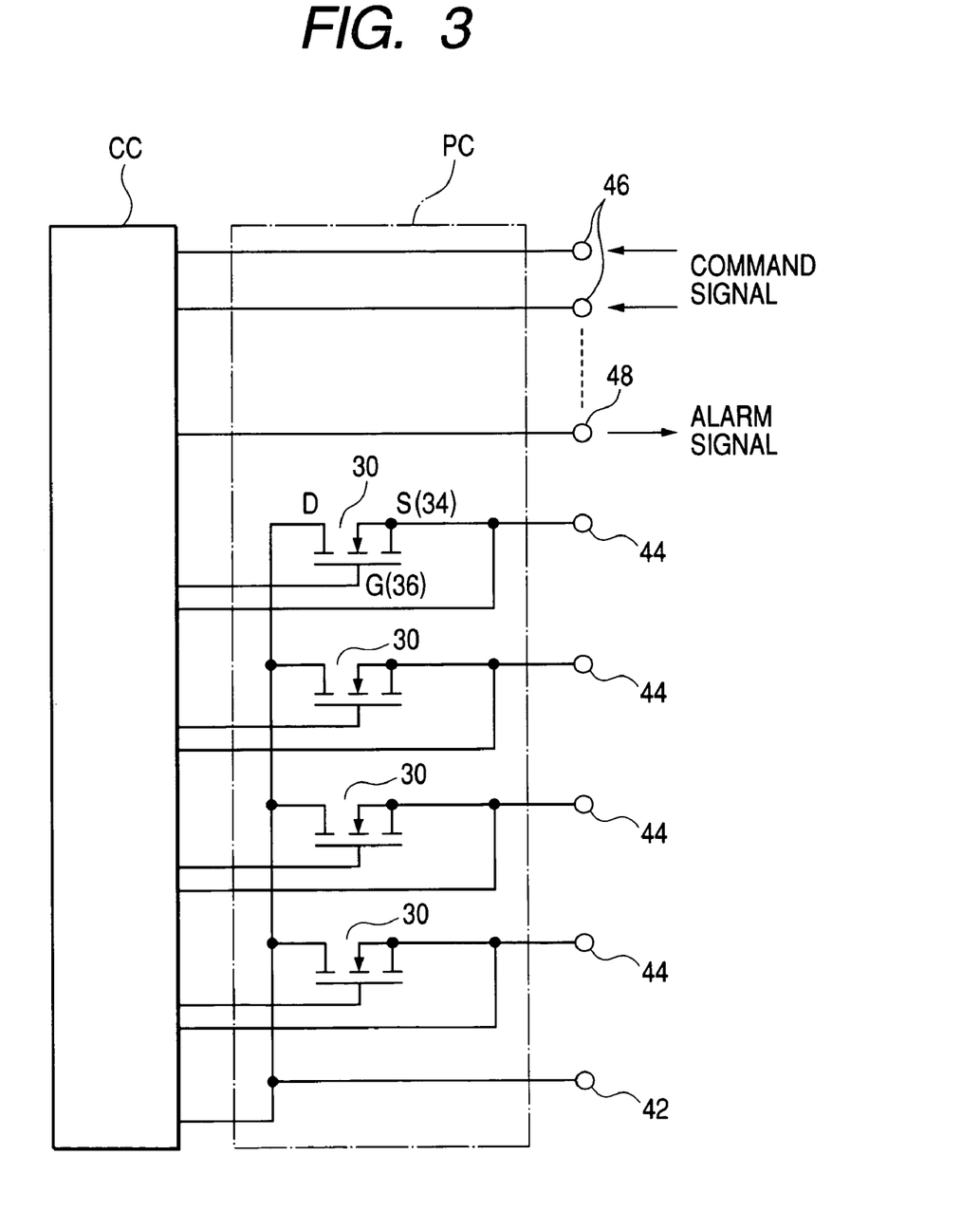
FIG. 3 is a drawing showing a distributing circuit constructed of the circuit structural body.

The printed circuit board 20 constitutes a distributing circuit as shown in FIG. 3, according to the present embodiment. The distributing circuit includes an power circuit unit PC and a control circuit unit CC.

The power circuit unit PC is adapted to distributively output a power source supplied from the common input terminal 42 through the respective FETs 30 to a plurality of output terminal 44, and is configured in such a manner that drains of the respective FETs 30 are connected to a common input terminal 42, and sources of the FETs 30 are connected to the output terminals 44 corresponding to the respective FETs 30.

The control circuit unit CC is adapted to output the ON/OFF signal of the respective FETs 30 or alarm signal from a signal output terminal 48, and gates of the respective FETs 30 are connected to this control circuit unit CC.

The input terminal 42, the output terminal 44, the signal input terminal 46, and the signal output terminal 48 are formed of the terminal pins 40 described above.

Subsequently, a method of manufacturing the circuit structural body, and the detailed structure obtained by such method will be described in accordance with the order of the steps.

1) Board Manufacturing Step

In the first step, the printed circuit board 20 is manufactured.

Figure 4:
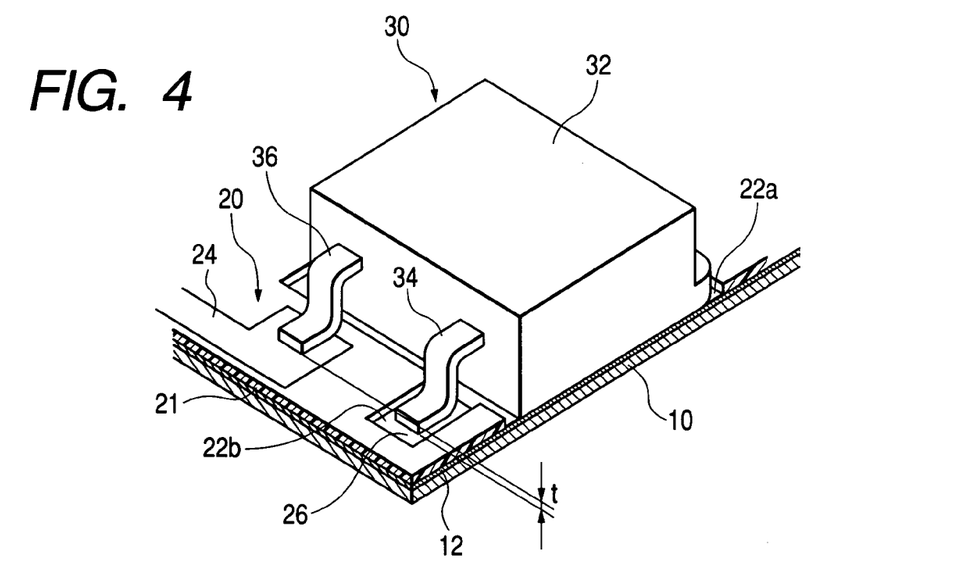
FIG. 4 is an enlarged perspective view showing the FETs mounting state in the circuit structural body.

As shown in FIG. 2 and FIG. 4, the board body 22 of the printed circuit board 20 is formed of an insulating material such as epoxy resin or the like into a plate shape (more preferably, to a thin-sheet shape). A conductive pattern for control circuit 24 (see FIG. 2 and FIG. 4) constituting the control circuit unit CC shown in FIG. 3 is printed on one of the surfaces (upper surface in the example shown) of the board body 22, and a conductive pattern for power circuit 26 constituting the power circuit unit PC is printed on the other surface (lower surface in the example shown). In addition, at adequate locations on the board body 22, through-holes 22a, 22b for mounting the FETs 30 to the conductive pattern for power circuit 26 from the back side thereof, which will be described in detail later, are formed.

2) Reinforcing Plate Fixing Step

A reinforcing plate 10 is placed on the lower surface of the printed circuit board 20 so as to be laminated on the conductive pattern for power circuit 26 via an insulating adhesive sheet (insulating layer) 12. The reinforcing plate 10 is adapted to increase rigidity of the printed circuit board 20, and a metal plate or a hard plastic plate may be employed. By employing an aluminum plate or an aluminum alloy plate for the reinforcing plate 10, heat dissipating property of the circuit structural body may further be enhanced. When employing the insulating plate formed of hard plastic plate or the like, the insulating layer such as the insulating adhesive sheet 12 is not necessarily required.

The reinforcing plate 10 may be provided not only on the side of the conductive pattern for power circuit 26, but also on the side of the conductive pattern for control circuit 24 in layers. However, since a relatively high current flows in the conductive pattern for power circuit 26, and heat from the FETs 30 can easily be transmitted thereto, heat dissipation efficiency is enhanced by laminating the reinforcing plate 10 on the side of the conductive pattern 26.

3) Mounting Step (FIG. 4)

Using the through-holes 22a and 22b formed in the board body 22 of the printed circuit board 20, the FETs 30 are mounted with respect to both of the conductive pattern 24 and 26 on the printed circuit board 20 from the side opposite from the reinforcing plate 10 (upper side in the drawing).

The FET 30 used in this embodiment, having a body of substantially rectangular parallelepiped as shown in FIG. 4, includes a thin-plate shaped drain terminal, not shown, on the back surface thereof, and a source terminal 34 and a gate terminal 36 projected downwardly from the side surface of the body 32.

In the board manufacturing step, a rectangular through-hole 22a through which the body 32 can be inserted and a through-holes 22b extending from the rectangular portion 22a to a predetermined direction and having such shape that the source terminal 34 can be inserted are formed in advance. In this mounting step, the drain terminal on the back surface of the FET body 32 is mounted to the conductive pattern for power circuit 26 on the lower surface of the board through the through-hole 22a from the back side, the source terminal 34 is also mounted to the same conductive pattern for power circuit 26 through the through-hole 22b and, simultaneously, the gate terminal 36 is mounted to the conductive pattern for control circuit 24 on the upper surface of the board from the front side.

In other words, in this mounting step, all the FETs 30 can be mounted simultaneously to the conductive patterns 24 and 26 from the upper side, and thus the efficiency of the assembling work is dramatically improved in comparison with the method in which the FETs 30 are connected individually to both the bus-bar board and the printed circuit board at a position between the two via wiring materials respectively in the related art.

In particular, by performing the reinforcing plate fixing step described above in advance, sufficient supporting rigidity of the printed circuit board 20 is ensured for soldering work, and thus the working efficiency and the mounting accuracy are further improved.

When performing the mounting step, it is more preferable to provide a step t having a height corresponding substantially to the thickness of the printed circuit board 20 between the source terminal 34 and the gate terminal 36 in advance as shown in FIG. 4. In this arrangement, the respective terminals 34, 36 may be mounted to the bus bar 12 for the output terminal and the printed circuit board 20 as-is irrespective of the thickness of the printed circuit board 20 without forcing both terminals 34 and 36 to be deformed. Therefore, the stress exerted to the respective terminals after mounting can significantly be reduced.

Figure 5A:
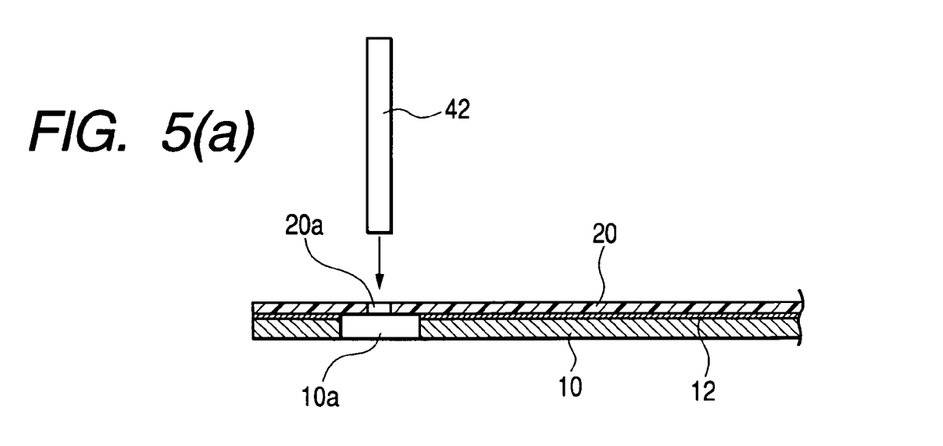
FIGS. 5(a) and 5(b) are cross sectional view showing a terminal connecting step in the circuit structural body.
Figure 5B:
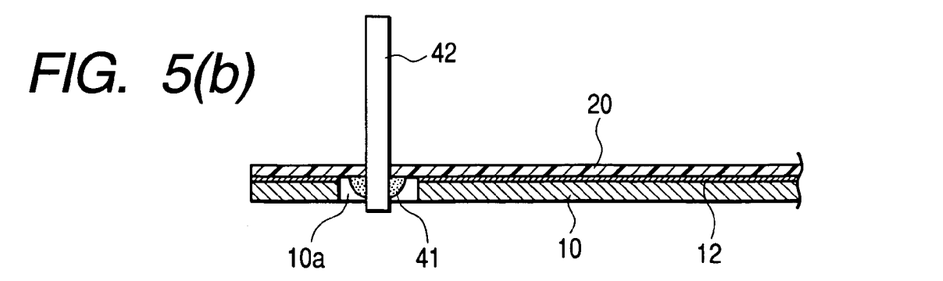

4) Terminal Connecting Step (FIGS. 5(a) and 5(b))

In addition to the through-holes for mounting the FETs such as the through holes 22a, and 22b, the printed circuit board 20 is provided with through holes 20a for connecting terminals so that the terminal pins 40 constituting the respective terminals 42, 44, 46, and 48 shown in FIG. 3 can pass through, and with through-hole 10a which is slightly larger than the through-hole 20a also on the insulation adhesive sheet 12 and the reinforcing plate 10. Then, the end of the terminal pin 40 is inserted into the through holes 20a, 10a from the opposite side of the reinforcing plate 10 (upper side in FIGS. 5(a) and 5(b)), and the terminal pin 40 is connected directly to the conductive pattern for power circuit 26 (or to the conductive pattern for control circuit 24 via the through hole) by supplying solder 41 to the inserted end through the through-hole 10a.

Accordingly, the external connecting terminal is upwardly projected from the printed circuit board 20, and thus the external wiring material can be connected to the respective terminals from one side (upper side), thereby simplifying the connecting work.

5) Case Mounting Step (Connector Forming Step)

The case 50 formed of insulating material such as synthetic resin or the like (see FIG. 1 and FIG. 2) is covered on the printed circuit board 20 from above and secured by screw 14 or the like shown in FIG. 1. The case 50, opening downward, has a shape to cover the entire printed circuit board 20 from above, and includes an opening for exposing the FETs 30 upward at the center thereof and a water-proof wall 52 extending upward from the periphery of the opening. In other words, the water-proof wall 52 surrounds the area including the FETs 30. Projected downwardly from the front and back ends of the case 50 are a plurality of fin covers 58 arranged side by side in the lateral direction (FIG. 1).

The cylindrical housing 54 opening upward and downward is integrally formed with the case 50 at both the left and the right edges of the case 50 (the outer left and right sides of the water-proof wall 52). The housing 54 includes the terminal pin 40 constituting the input terminal 42, the terminal pin 40 constituting the output terminal 44, and the terminal pins 40 constituting the signal input terminal 46 and the signal output terminal 48 individually, and constituting the connector together with these terminal pins 40.

By connecting the connector thus configured, and the connector provided at the end of the wire harness, which is provided, for example, on a vehicle, the terminal and the external circuit can easily be connected.

According to the present invention, the connector housing is not necessarily required to be formed integrally with the case 50, and they may be assembled after forming them as separate members.

6) Heat Dissipating Member Connecting Step

The heat dissipating member 60 as shown in FIGS. 1 and 2 is bonded to the lower surface of the reinforcing plate 10 to unite them.

The heat dissipating member 60 is formed entirely of material which is superior in heat conductivity such as aluminum based metal, and an extrusion mold may be employed for the one which has a constant cross-section as shown in the drawing. The upper surface of the heat dissipating member 60 serves as a flat bonded surface 64, and the reinforcing plate 10 is bonded to the bonded surface 64 via the insulating layer 66 shown in FIG. 2. The plurality of fins 62 arranged side by side in the lateral direction are projected downwardly from the lower surface of the heat dissipating member 60, and the positions of the respective fins 62 correspond to the positions of the fin covers 58 on the case 50. Therefore, by mounting the heat dissipating member 60 to the case 50, both ends of the respective fins 62 in the longitudinal direction are covered by the fin covers 58.

Bonding between the heat dissipating member 60 and the reinforcing plate 10 and formation of the insulating layer 66 are preferably performed in accordance with the procedure described below.

(1) Forming a thin film insulating layer by applying an insulative adhesive agent formed of epoxy resin on the upper surface 64 of the heat dissipating member 60 and drying the same.

(2) Applying an adhesive agent formed of the same material as that constituting the insulating layer, or an adhesive agent being softer and having higher heat conductivity (for example, grease such as silicone based adhesive agent) over the insulating layer, or applying similar adhesive agent on the side of the reinforcing plate 10 to bond the insulating layer and the reinforcing plate 10.

Here, formation of the insulating layer 66 is possible by the adhesive agent described in (2) above even when the insulating layer in (1) is omitted. However, insulation between the reinforcing plate 10 and the heat dissipating member 60 is further ensured by following the steps of (1) and (2). In particular, in the case where the heat dissipating member 60 is connected to a body earth to bring the electric potential to zero, difference in electric potential between the heat dissipating member 60 and the power circuit increases. Therefore, it is more preferable to provide reliable insulating property to the insulating layer 66. It is also possible to form the insulating layer in (1) for example by bonding the insulating sheet to the bonded surface 64 of the heat dissipating member 60.

When the conductive pattern for power circuit includes a part to be earthed, the conductive pattern may be connected to the earth via the heat dissipating member 60.

When a shoulder 55 is formed on the case 50 so that the periphery of the printed circuit board 20 abuts thereto as shown in FIG. 2, and the heat dissipating member 60 is connected and fixed to the case 50 in such a manner that the printed circuit board 20 is interposed between the shoulder 55 and the heat dissipating member 60, the printed circuit board 20 can be held in a more stable state.

Figure 6A:
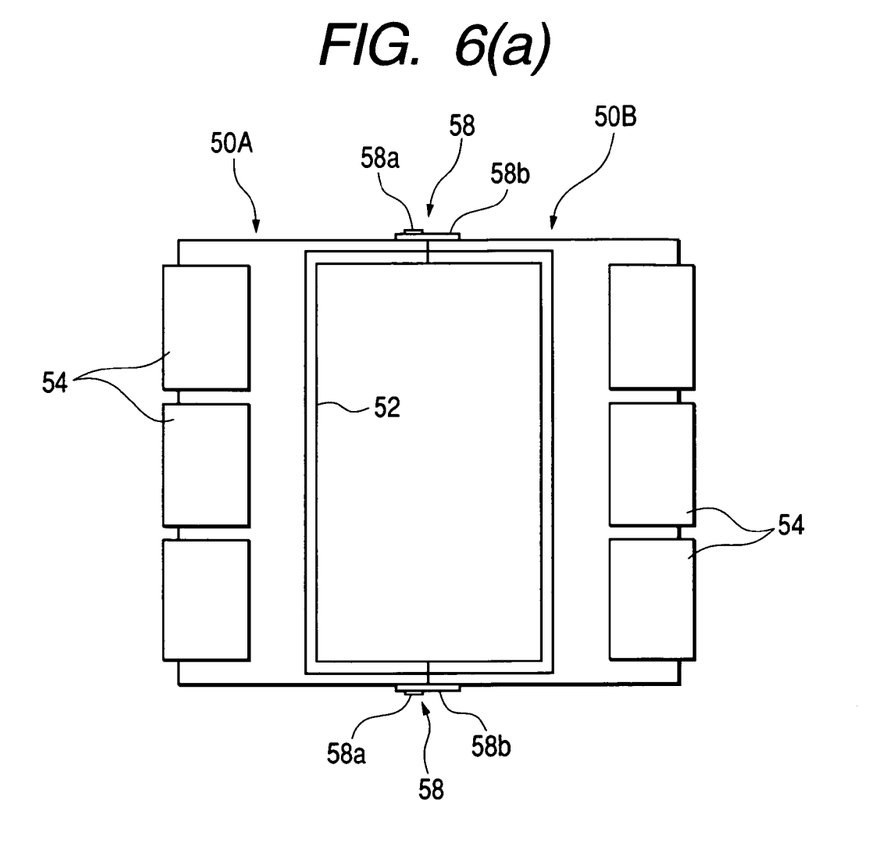
FIG. 6(a) is a plan view of a case for the circuit structural body including divided case halves.
Figure 6B:
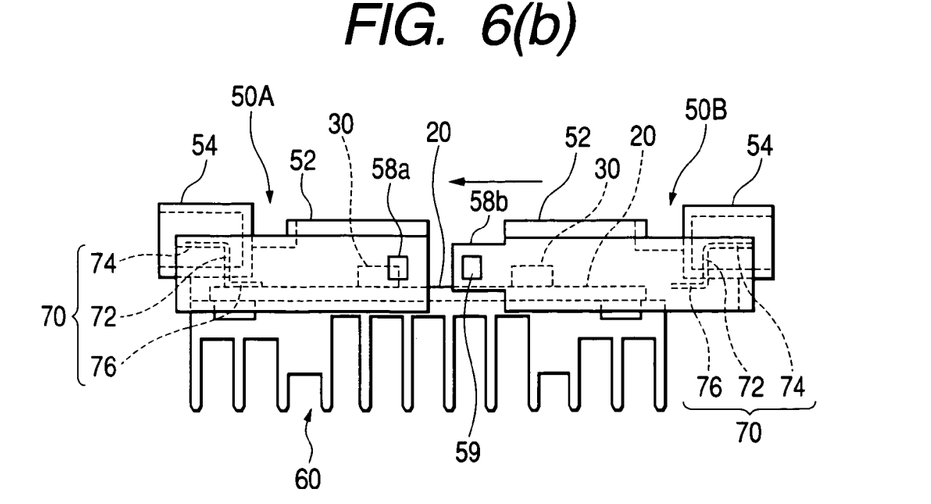
FIG. 6(b) is a front view thereof.

Alternatively, as shown in FIGS. 6(a) and 6(b), the holding force of the printed circuit board 20 may be increased by dividing the case 50 along the direction parallel with the direction of the printed circuit board 20 (lateral direction in the drawing) and connecting the divided case halves 50A and 50B together with the printed circuit board 20 interposed therebetween.

In the example shown in the drawing, terminals 70 are integrally molded to the case halves 50A and 50B instead of the terminal pins 40. The respective terminals 70 are integrally formed with the connecting portion 72 passing through the bottom wall of the case-side housing 54 in the vertical direction, an exterior side terminal 74 projecting toward the opening of the housing from the upper end of the connecting portion 72, and a board-side terminal 76 projecting from the lower end of the connecting portion 76 toward the side, so that the board-side terminal 76 is connected to the adequate conductive pattern on the printed circuit board 20.

A connecting arm 58b extends from the divided case half 50B to the divided case 50A, so that the connecting state between both of the divided case halves 50A and 50B are locked when a through hole 59 formed at the end of the connecting arm 58b and a projection 58a formed on the outer side of the divided case half 50A are engaged with each other.

7) Potting Step

An adequate potting agent for heat dissipation is injected inside the waterproof wall 52. Then, a lid 70 shown in FIG. 1 and FIG. 2 is placed on the upper end of the waterproof wall 52 and is fixed by welding or the like, so that the inside of the waterproof wall 52 is sealed. Accordingly, the waterproof effect of the circuit structural body is further enhanced.

According to the circuit structural body manufactured in the manner described above, a circuit for distributing an electric power from the power source to the adequate electric load is established by connecting the power source to the input terminal 42 of the power circuit unit PC, and by connecting the electric load to the output terminal 44, respectively. In addition, ON/OFF control of the distributing circuit is performed by the action of the FETs 30 provided on route of the circuit, being controlled by the control circuit unit CC.

The circuit structural body according to the present invention is not limited to those manufactured by the method described above, and the effects of simplification and slimming of the entire structure are achieved by the structure in which the conductive pattern for power circuit 26 is formed on one of the surfaces of the printed circuit board 20 and the conductive pattern for control circuit 24 is formed on the other surface, and the semiconductor switching elements are mounted to both of the conductive patterns 24 and 26.

The semiconductor switching element used in the present invention is not limited to the FET, and those including the conducting terminal to be connected to the power circuit side formed by the bus-bar and the control terminal to be connected to the printed circuit board 20 may be widely applied.

As was described, since the present invention is constructed in such a manner that the printed circuit board is formed with the power circuit on one of the surfaces with the intermediary of the semiconductor switching element and the control circuit for controlling the semiconductor switching element on the other surface thereof, and the semiconductor switching element is mounted simultaneously to both of the circuits by means of the through-hole provided on the printed circuit board, both of the power circuit including the semiconductor switching element and the control circuit are established in a simple and slim structure, and thus the circuit structural body which is superior in heat dissipation in comparison with the one having the semiconductor switching element enclosed between the bus-bar board and the control circuit board as in the related art is provided.

When manufacturing the circuit structural body, the manufacturing efficiency of the circuit structural body can be dramatically improved by a method of manufacturing the printed circuit board, fixing a reinforcing plate on one of the surfaces thereto, and mounting the semiconductor switching element from the side opposite from the reinforcing plate.

What is claimed is:

1. A circuit structural body comprising:
   a semiconductor switching element;
   a power circuit for outputting an inputted electric power through the semiconductor switching element;
   a control circuit for controlling drive of the semiconductor switching element; and
   a printed circuit board having a board body, a conductive pattern constituting the power circuit and disposed on one surface thereof, and a conductive pattern constituting the control circuit and disposed on the other surface thereof;
   wherein the board body has a through-hole for mounting the semiconductor switching element thereon; and
   the semiconductor switching element is mounted to one of the conductive patterns on the printed circuit board from the front side of the conductive pattern, and to the other conductive pattern from the backside of the conductive pattern through the through-hole, and a portion of the semiconductor switching element is positioned within the through-hole.

2. The circuit structural body according to claim 1, further comprising a reinforcing plate laminated over one of the conductive patterns of the printed circuit board to which the semiconductor switching element is mounted from the backside of the conductive pattern.

3. The circuit structural body according to claim 2, wherein the reinforcing plate is formed of an aluminum plate or an aluminum alloy plate; and
   the reinforcing plate is overlapped on one of the conductive pattern on the printed circuit board via an insulating layer.

4. The circuit structural body according to claim 1, wherein the semiconductor switching element has a conductive terminal on the back side of a main body thereof;
   the through-hole has a size which can accommodate the main body of the semiconductor switching element therein; and
   the conductive terminal on the backside of the main body of the semiconductor switching element is mounted to the conductive pattern which constitutes the power circuit via the through-hole.

5. The circuit structural body according to claim 4, further comprising a reinforcing plate formed of aluminum or aluminum alloy and fixed via an insulating layer to one of the surfaces of the printed circuit board having the conductive pattern which constitutes the power circuit thereon.

6. The circuit structural body according to claim 2, wherein the reinforcing plate is fixed to a heat dissipating member via an insulating layer.

7. The circuit structural body according to claim 5, wherein the reinforcing plate is fixed to a heat dissipating member via an insulating layer.

8. The circuit structural body according to claim 1, wherein a terminal for connecting the power circuit or the control circuit to an external circuit is connected to the adequate conductive pattern on the printed circuit board.

9. The circuit structural body according to claim 8, further comprising:
   a case for accommodating the printed circuit board; and
   a housing disposed on the case for surrounding the terminal and constituting a connector together with the terminal.

10. The circuit structural body according to claim 9, wherein the terminal is fixed to the printed circuit board in a state in which the terminal penetrates through the printed circuit board in the direction of thickness of the printed circuit board and projects into the housing through the case in the direction of thickness.

11. The circuit structural body according to claim 9, wherein the case is divided along the direction parallel to the printed circuit board; and
   divided case halves are connected to each other with the printed circuit board interposed therebetween.

12. The circuit structural body according to claim 9, further comprising a heat dissipating member for cooling the printed circuit board;
   wherein the printed circuit board is interposed between the heat dissipating member and the case.

13. A method of manufacturing a circuit structural body provided with a power circuit for outputting an electric power supplied to an input unit to an output unit via a semiconductor switching element, and a control circuit for controlling drive of the semiconductor switching element, the method comprising the steps of:
   manufacturing a printed circuit board having a board body, a conductive pattern constituting the power circuit and disposed on one surface thereof, a conductive pattern constituting the control circuit and disposed on the other surface thereof, and a through-hole for mounting the semiconductor switching element on the board body;
   fixing a reinforcing plate to one surface of the printed circuit board via an insulating layer; and
   mounting the semiconductor switching element directly to one of the conductive patterns on the printed circuit board from the opposite side to the reinforcing plate and mounting the same to the other conductive pattern through the through-hole, a portion of the semiconductor switching element being positioned within the through-hole.

14. The method of manufacturing a circuit structural body according to claim 13, wherein a step having a height corresponding substantially to the thickness of the printed circuit board is provided before the mounting step between the terminal of the semiconductor switching element which is to be mounted to the conductive pattern on the front side of the printed circuit board and the terminal of the same which is to be mounted through the through-hole.

15. The method of manufacturing a circuit structural body according to claim 13, further comprising the step of connecting a terminal for connecting the power circuit or the control circuit to the external circuit to the adequate conductive pattern on the printed circuit board;
   wherein the connecting step is conducted after the manufacturing step and in a state in which the terminal being passed through the printed circuit board.

16. The method of manufacturing a circuit structural body according to claim 15, further comprising the step of forming a housing of an insulating material around the terminal;
   wherein the forming step is conducted after the connecting step.

17. The method of manufacturing a circuit structural body according to claim 13, wherein the reinforcing plate formed of aluminum or aluminum alloy is fixed to the printed circuit board in the fixing step; and
   a heat dissipating member is connected to the reinforcing plate via an insulating layer after the mounting step.

* * * * *